United States Patent
Yoshikawa

(10) Patent No.: US 8,811,713 B2
(45) Date of Patent: Aug. 19, 2014

(54) PHOTOMASK INSPECTION METHOD, SEMICONDUCTOR DEVICE INSPECTION METHOD, AND PATTERN INSPECTION APPARATUS

(75) Inventor: Ryoji Yoshikawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1419 days.

(21) Appl. No.: 12/533,321

(22) Filed: Jul. 31, 2009

(65) Prior Publication Data

US 2010/0054577 A1    Mar. 4, 2010

(30) Foreign Application Priority Data

Sep. 4, 2008 (JP) .................................. 2008-227177

(51) Int. Cl.
- *G06K 9/00* (2006.01)
- *G03H 1/04* (2006.01)
- *G06F 17/50* (2006.01)

(52) U.S. Cl.
USPC .................................. 382/144; 430/5; 703/14

(58) Field of Classification Search
CPC ............. G03F 1/84; G03F 1/36; G03F 1/144; G03F 1/26; G03F 1/72; G03F 7/7065; G06T 2207/30148; G06T 7/001; G06T 7/0004; G06T 7/0006; G06T 2207/10152; G06T 2207/30164; G06T 5/009; G06T 5/40
See application file for complete search history.

(56) References Cited

U.S. PATENT DOCUMENTS

| | | | |
|---|---|---|---|
| 5,843,799 A * | 12/1998 | Hsu et al. ........................... | 438/6 |
| 5,960,253 A * | 9/1999 | Fujino ................................ | 438/4 |
| 6,846,597 B2 * | 1/2005 | Narukawa et al. ................ | 430/5 |
| 7,381,986 B2 * | 6/2008 | Keller et al. .................... | 257/48 |
| 7,425,391 B2 | 9/2008 | Zhang | |
| 7,570,796 B2 * | 8/2009 | Zafar et al. ..................... | 382/144 |
| 2005/0111727 A1 * | 5/2005 | Emery ........................... | 382/145 |
| 2006/0280358 A1 * | 12/2006 | Ishikawa ....................... | 382/149 |
| 2007/0105024 A1 * | 5/2007 | Rankin et al. ..................... | 430/5 |
| 2007/0156379 A1 * | 7/2007 | Kulkarni et al. ................. | 703/14 |
| 2007/0230770 A1 * | 10/2007 | Kulkarni et al. .............. | 382/149 |
| 2007/0252986 A1 * | 11/2007 | Sandstrom .................... | 356/319 |
| 2007/0288219 A1 * | 12/2007 | Zafar et al. ..................... | 703/14 |

FOREIGN PATENT DOCUMENTS

| | | |
|---|---|---|
| JP | 2000-047369 | 2/2000 |
| JP | 2008-129477 | 6/2008 |

* cited by examiner

*Primary Examiner* — Ryan Zeender
*Assistant Examiner* — Dana Amsdell
(74) *Attorney, Agent, or Firm* — Finnegan, Henderson, Farabow, Garrett & Dunner, L.L.P.

(57) ABSTRACT

A plurality of photomasks used to manufacture the same semiconductor device, each of the photomasks having a plurality of mutually replaceable unit regions set therein, are inspected to detect a defect. It is determined whether or not the detected defect has a redundancy defect positioned in a unit region replaceable with another unit region to remedy the photomask. Then, when inspecting the second or subsequent photomask, a unit region including the coordinate of a redundancy defect detected in another photomask inspected previously is set to be a non-inspection region, and the non-inspection region is not inspected.

6 Claims, 6 Drawing Sheets

PHOTOMASK INSPECTION METHOD, SEMICONDUCTOR DEVICE INSPECTION METHOD, AND PATTERN INSPECTION APPARATUS

CROSS-REFERENCE TO RELATED APPLICATIONS

This application is based upon and claims the benefit of priority from the prior Japanese Patent Application No. 2008-227177, filed on Sep. 4, 2008; the entire contents of which are incorporated herein by reference.

BACKGROUND OF THE INVENTION

1. Field of the Invention

The present invention relates to a photomask inspection method, a semiconductor device inspection method, and a pattern inspection apparatus which inspect a pattern of an inspection object in which a plurality of mutually replaceable unit regions are set.

2. Background Art

Conventionally, the existence or absence of defects in a semiconductor device including fine structures is inspected by capturing an optical image of the semiconductor device and comparing the optical image to reference data created based on design data and the like. Similar methods are used to inspect the existence or absence of defects also for photomasks used to manufacture such a semiconductor device (for example, refer to JP-A 2000-47369 (Kokai)).

However, in recent years, large scales and high integration have advanced for semiconductor devices experiencing rapidly growing demand such as nonvolatile semiconductor memory and LSIs with embedded memory. Attempting to manufacture a semiconductor device without any defects would result in undesirably low yields. Large scales and high integration have advanced similarly for photomasks used to manufacture such semiconductor devices. Attempting to manufacture a photomask without any defects also would result in undesirably low yields.

Redundancy technology is therefore applied to semiconductor devices and photomasks. Redundancy technology is a technology that remedies the semiconductor device or the photomask by making unit regions for redundancy beforehand in addition to the originally necessary unit regions such that a unit region in which a defect has occurred can be replaced with a redundant normal unit region. Thereby, the entire semiconductor device or photomask is prevented from being defective due to a small number of defects, and yields can be improved. In the case where the semiconductor device is, for example, a nonvolatile semiconductor memory, the unit region is, for example, a memory cell. The number of remediable unit regions for the semiconductor device and the photomask is determined by the number of unit regions made beforehand for redundancy.

However, in recent years, large scales and high integration are advancing even further for semiconductor devices and photomasks while the number of remediable unit regions is limited. Therefore, it remains difficult to manufacture semiconductor devices and photomasks with high yield even when using redundancy technology.

SUMMARY OF THE INVENTION

According to an aspect of the invention, there is provided a photomask inspection method inspecting a plurality of photomasks used to manufacture the same semiconductor device, each of the photomasks including a plurality of mutually replaceable unit regions set therein, the method including: inspecting one of the photomasks to detect a defect; and determining whether or not the detected defect includes a redundancy defect positioned in one of the unit regions replaceable with another of the unit regions to remedy the one of the photomasks, one of the unit regions not being inspected when inspecting one of the photomasks in the case where the one of the unit regions includes a coordinate of the redundancy defect detected in another of the photomasks inspected previously.

According to another aspect of the invention, there is provided a photomask inspection method inspecting a plurality of photomasks used to manufacture the same semiconductor device, each of the photomasks including a plurality of mutually replaceable unit regions set therein, the method including: inspecting one of the photomasks to detect a defect; determining whether or not the detected defect includes a redundancy defect positioned in one of the unit regions replaceable with another of the unit regions to remedy the one of the photomasks; and outputting information regarding the detected defect, information not being output for a defect detected in one of the photomasks in the case where the defect has a coordinate in one of the unit regions including a coordinate of the redundancy defect detected in another of the photomasks inspected previously.

According to another aspect of the invention, there is provided a semiconductor device inspection method inspecting an intermediate structural body of each of a plurality of manufacturing stages for a semiconductor device including a plurality of mutually replaceable unit regions set therein, the method including: inspecting the intermediate structural body to detect a defect; and determining whether or not the detected defect includes a redundancy defect positioned in one of the unit regions replaceable with another of the unit regions to remedy the semiconductor device, one of the unit regions not being inspected when inspecting the intermediate structural body of one manufacturing stage in the case where the one of the unit regions includes a coordinate of the redundancy defect detected in the intermediate structural body of a previous manufacturing stage.

According to another aspect of the invention, there is provided a semiconductor device inspection method inspecting an intermediate structural body of each of a plurality of manufacturing stages for a semiconductor device including a plurality of mutually replaceable unit regions set therein, the method including: inspecting the intermediate structural body to detect a defect; determining whether or not the detected defect includes a redundancy defect positioned in one of the unit regions replaceable with another of the unit regions to remedy the semiconductor device; and outputting information regarding the detected defect, information not being output for a defect detected in the intermediate structural body of one manufacturing stage in the case where the defect has a coordinate in one of the unit regions including a coordinate of the redundancy defect detected in the intermediate structural body of a previous manufacturing stage.

According to another aspect of the invention, there is provided a pattern inspection apparatus inspecting a pattern of an inspection object including a plurality of mutually replaceable unit regions set therein, the apparatus including: a redundancy map storage unit storing a redundancy map indicating a disposition of the unit regions of the inspection object; an image capture unit acquiring an optical image of the inspection object; a defect determination unit comparing the optical image to a reference image to detect a defect, determining whether or not a detected defect includes a redundancy defect positioned in one of the unit regions replaceable with another of the unit regions to remedy the inspection object, writing a coordinate of the redundancy defect to the redundancy map storage unit, and outputting information regarding the detected defect; and a control unit identifying, from the unit regions written to the redundancy map, one of the unit regions including a coordinate of the detected redundancy defect and controlling at least one of the image capture unit and the defect determination unit based on the identification result.

BRIEF DESCRIPTION OF THE DRAWINGS

FIGS. 4A, 4C, 4E, and 4G illustrate inspection results, and 4B, 4D, 4F, and 4H illustrate redundancy maps;

FIGS. 6A, 6C, 6E, and 6G illustrate inspection results, and 6B, 6D, 6F, and 6H illustrate redundancy maps.

DETAILED DESCRIPTION OF THE INVENTION

Embodiments of the present invention will now be described with reference to the drawings.

A first embodiment of the present invention will be described first.

Figure 1:
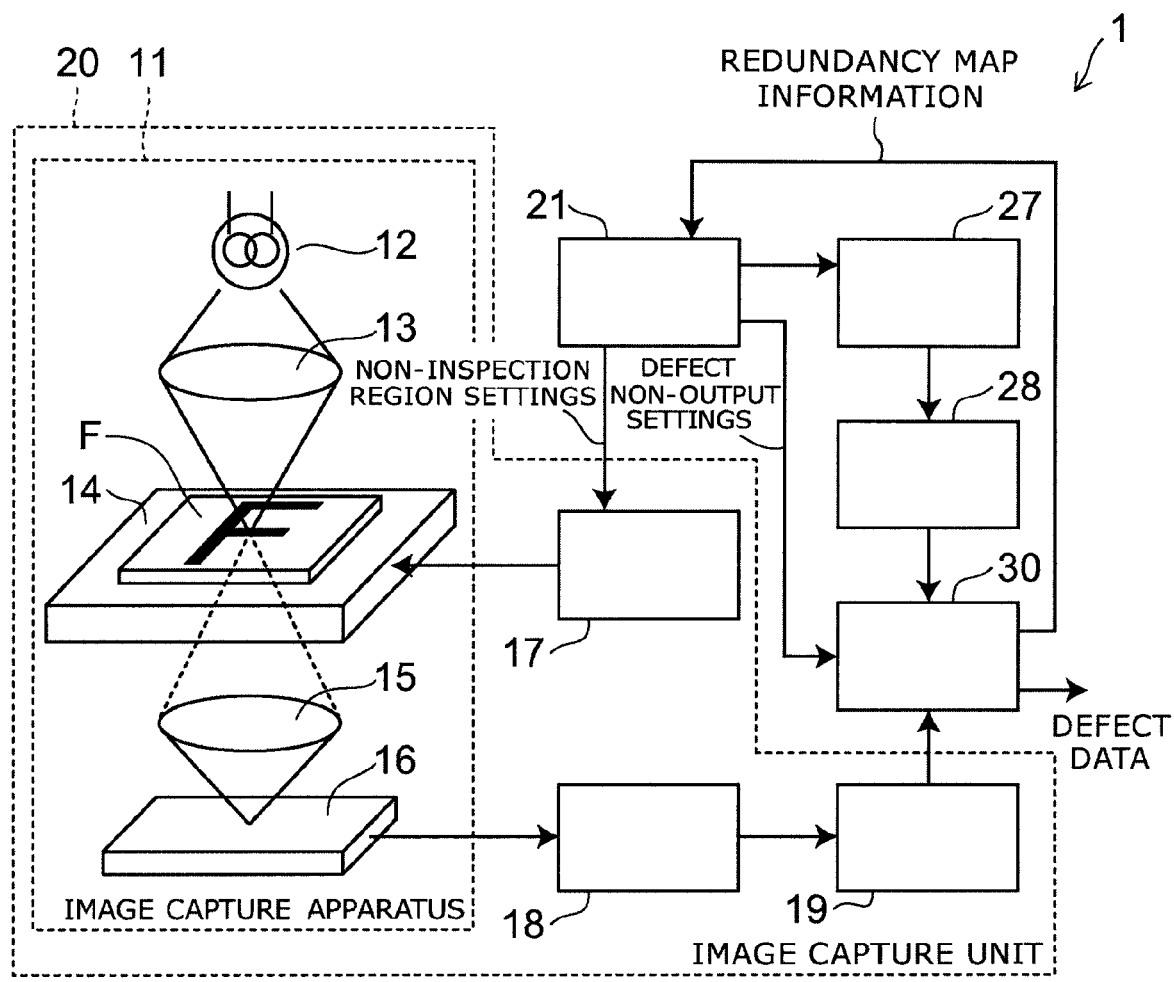
FIG. 1 is a block diagram illustrating a pattern inspection apparatus according to a first embodiment of the invention.

FIG. 1 is a block diagram illustrating a pattern inspection apparatus according to this embodiment.

Figure 2:
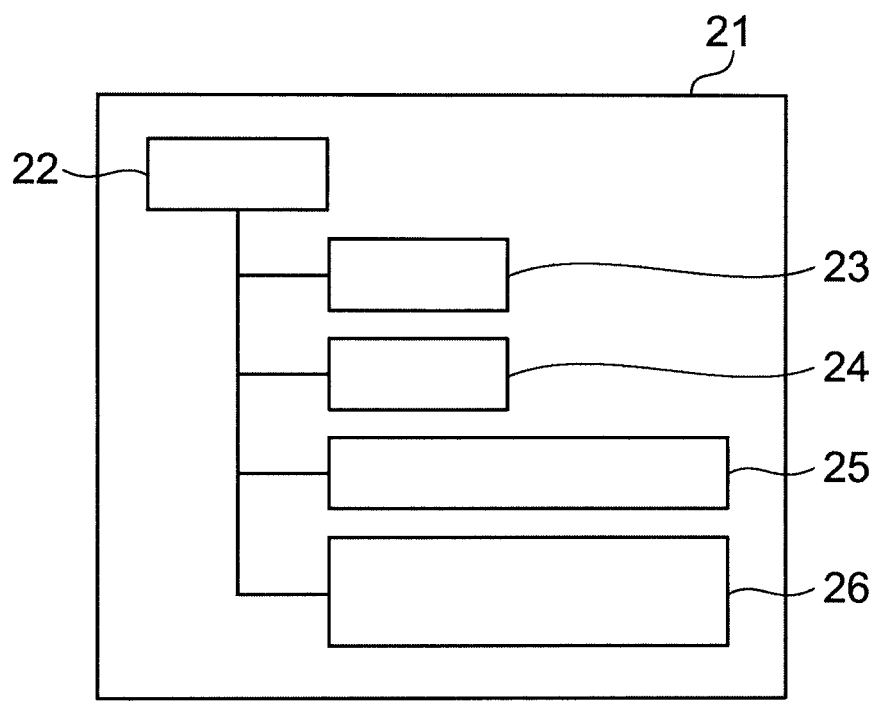
FIG. 2 is a block diagram illustrating a calculator illustrated in FIG. 1.

FIG. 2 is a block diagram illustrating a calculator illustrated in FIG. 1.

The pattern inspection apparatus according to this embodiment is an apparatus that inspects an inspection object on which a pattern is formed. More specifically, the pattern inspection apparatus is an inspection apparatus of a photomask. The objects to be inspected by the inspection apparatus according to this embodiment are a plurality of photomasks used to manufacture the same semiconductor device. In other words, the semiconductor device is manufactured by implementing photolithography on a semiconductor wafer using the photomasks sequentially.

Redundancy technology is applied to the photomask. In other words, a plurality of mutually replaceable unit regions are set in the photomask. One type of unit region may be used, and all of the unit regions may be mutually replaceable; or a plurality of types of unit regions may be used with unit regions of the same type being mutually replaceable. The pattern inspection apparatus according to this embodiment inspects one photomask at a time.

A pattern inspection apparatus 1 according to this embodiment illustrated in FIG. 1 includes an image capture apparatus 11 that captures an image of a photomask F. i.e., the inspection object. The image capture apparatus 11 includes a light source 12. A condensing lens 13, an XY stage 14, an objective lens 15 and an image sensor 16 are disposed in this order on an optical axis of the light source 12. The light source 12 includes, for example, a mercury lamp or an argon laser oscillator. The condensing lens 13 is, for example, a convex lens that concentrates light radiated by the light source 12 into a limited region on the XY stage 14. The XY stage 14 holds the photomask F and can be moved freely in a prescribed region in a plane substantially orthogonal to the optical axis of the light source 12. The objective lens 15 is, for example, a convex lens that concentrates light passing through the photomask F toward the image sensor 16. The image sensor 16 includes, for example, a CCD sensor having a plurality of CCDs (Charge-Coupled Devices) arranged in one or two dimensions.

The inspection apparatus 1 includes a stage control circuit 17 that outputs a control signal to the XY stage 14 and drives the XY stage 14 to control the position of the photomask F. The inspection apparatus 1 sequentially receives an analog signal from the image sensor 16 of the image capture apparatus 11 and includes a sensor circuit 18 that creates an optical image of the photomask F based on the analog signal. The inspection apparatus 1 also includes an A/D conversion circuit 19 that converts the analog optical image created by the sensor circuit 18 to a digital optical image. Hereinbelow, the digital optical image is referred to as "sensor image." An image capture unit 20 includes the image capture apparatus 11, the stage control circuit 17, the sensor circuit 18, and the A/D conversion circuit 19 to acquire the optical image (the sensor image) of the photomask F.

The inspection apparatus 1 also includes a calculator 21. As illustrated in FIG. 2, the calculator 21 includes a CPU (Central Processing Unit) 22. The CPU 22 connects to a ROM (Read-Only Memory) 23, a RAM (Random Access Memory) 24, a design data storage unit 25, and a redundancy map storage unit 26.

The CPU 22 is a control unit that controls each portion of the inspection apparatus 1. A program which is executed by the CPU 22 to operate the entire inspection apparatus 1 is stored in the ROM 23. The RAM 24 is a device that temporarily stores data used in operations of the CPU 22 and results of the operations of the CPU 22. Design data of the photomask F is stored in the design data storage unit 25. The design data includes, for example, data made by performing OPC (Optical Proximity Correction) on a pattern to be formed on the semiconductor device. However, OPC may not be performed on the design data in the case where a pattern having a relatively large minimum dimension is formed on the photomask.

A redundancy map is stored in the redundancy map storage unit 26. The redundancy map indicates information representing the disposition of the a plurality of mutually replaceable unit regions set in the photomask F, that is, the number of unit regions and the positions of each. The redundancy map is created, for example, based on design data stored in the design data storage unit 25 and design information regarding unit regions accompanying the design data. In the case where the semiconductor device to be manufactured is, for example, a semiconductor memory, "design information regarding the unit regions" refers to information regarding memory cells for redundancy. As described below, the coordinates of a defect determined to be a redundancy defect based on the inspection result of the photomask F also are stored in the redundancy map storage unit 26.

The pattern inspection apparatus 1 also includes a pattern transformation circuit 27. The pattern transformation circuit 27 transforms the design data of the photomask F stored in the design data storage unit 25 into multi-level data having about the same number of gradations as the resolution of the image sensor 16 for each pixel of about the same size as the resolution of the image sensor 16. The pattern transformation circuit 27 transforms the design data into binary data in the case where the optical image has a binary gradation.

The pattern inspection apparatus 1 includes a reference image creation circuit 28. The reference image creation circuit 28 creates a reference image by performing processing such as filter processing on the data transformed by the pattern transformation circuit 27 considering changes of the configuration due to etching processes and the like during patterning of the photomask, optical effects when capturing the image of the photomask, etc. A reference image creation unit includes the design data storage unit 25, the pattern transformation circuit 27, and the reference image creation circuit 28.

The pattern inspection apparatus 1 also includes a defect determination circuit 30 as a defect determination unit. The defect determination circuit 30 receives the optical image (the sensor image) of the photomask F from the A/D conversion circuit 19, receives the reference image from the reference image creation circuit 28, creates a difference image from the two images, and determines the existence/absence of a defect in the photomask F based on the difference image. The defect determination circuit 30 also determines whether or not the detected defect is a redundancy defect. "Redundancy defect" refers to an unrestorable defect for which the photomask F can be remedied by replacing the unit region in which the defect is positioned with another unit region, that is, a defect remediable by redundancy technology. Instead of the defect determination circuit 30, an operator may determine whether or not the detected defect is a redundancy defect and input the determination result into the defect determination circuit 30. Alternatively, the defect determination circuit 30 may perform a first determination, and the operator may then refer to the result of the first determination to perform a final determination. The defect determination circuit 30 acquires the coordinates of the redundancy defect and writes the coordinates to the redundancy map storage unit 26. The defect determination circuit 30 also outputs information (the defect data) regarding the defects including the redundancy defects to an exterior of the pattern inspection apparatus 1.

Operations of the pattern inspection apparatus according to this embodiment having the configuration described above, that is, a photomask inspection method according to this embodiment, will now be described.

Figure 3:
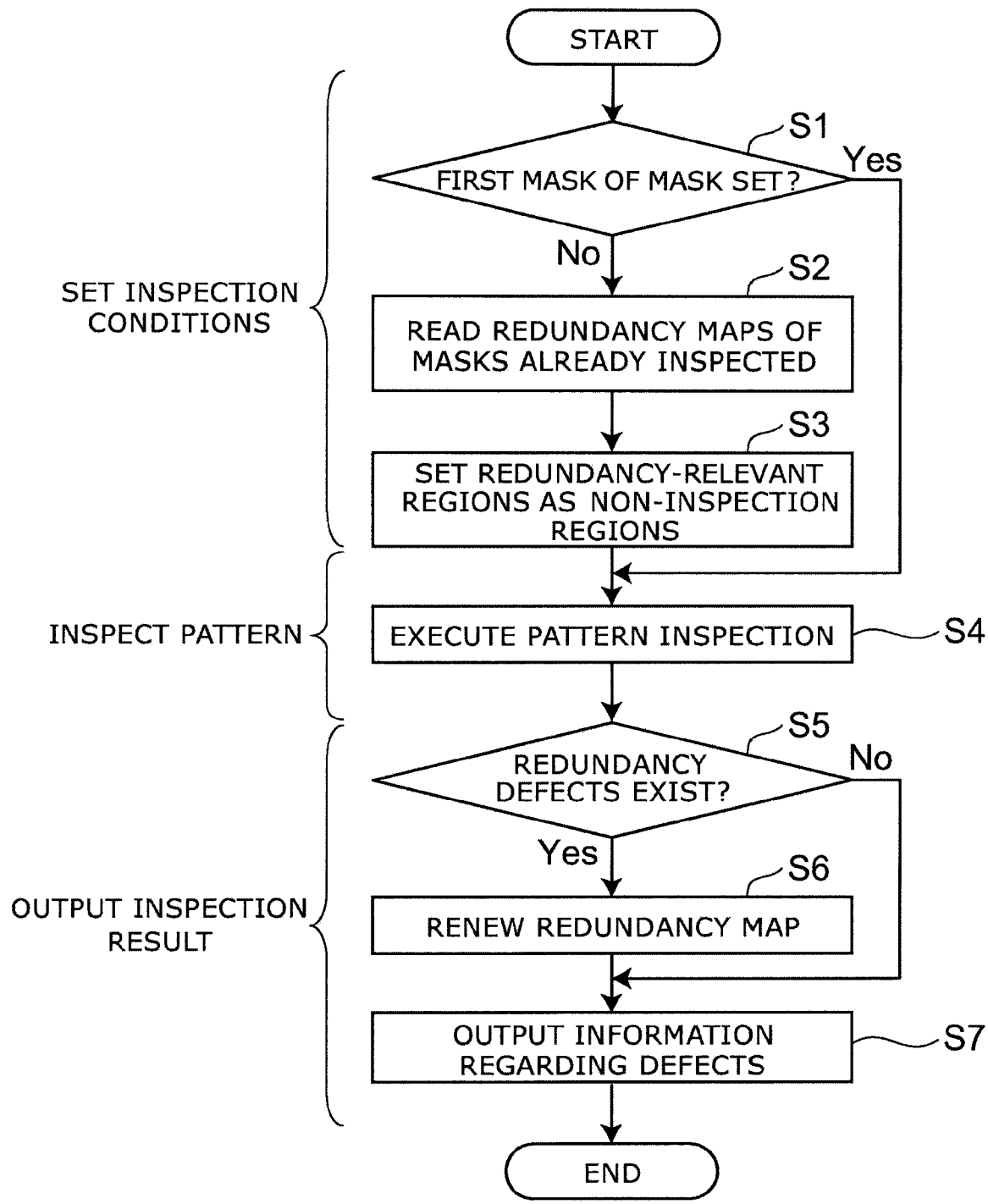
FIG. 3 is a flowchart illustrating a photomask inspection method according to the first embodiment.

FIG. 3 is a flowchart illustrating the photomask inspection method according to this embodiment.

FIGS. 4A to 4H illustrate the photomask inspection method according to this embodiment. FIGS. 4A, 4C, 4E, and 4G illustrate inspection results. FIGS. 4B, 4D, 4F, and 4H illustrate redundancy maps.

FIGS. 1 to 4H will now be described.

In this embodiment, a plurality of photomasks used to manufacture the same semiconductor device are sequentially inspected one at a time. As described above, each photomask includes a plurality of mutually replaceable unit regions set therein.

First, one photomask from a mask set including the plurality of photomasks used to manufacture the same semiconductor device is inspected.

The photomask F, i.e., the inspection object, is held by the XY stage 14. In this state, the CPU 22 of the calculator 21 reads and executes a program stored in the ROM 23 to execute the following steps.

First, as illustrated in step S1 of FIG. 3, it is determined whether or not the photomask F, i.e., the inspection object, is the first photomask of the mask set. The flow proceeds to step S4 in the case where the photomask F is the first photomask and proceeds to step S2 in the case where the photomask F is not the first photomask, that is, is the second or subsequent photomask. The operator may perform the determination and input the determination results into the calculator 21, or the CPU 22 may perform the determination by inputting the identification number, etc., of the photomask F online into the calculator 21. In the case where the photomask F is the first photomask of the mask set, the flow proceeds from step S1 to step S4, and the inspection of the photomask F is executed. The method for inspecting the photomask F will now be described in detail.

Figure 4A:
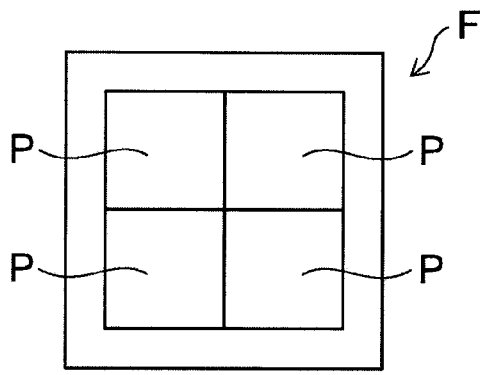
FIGS. 4A to 4H are views illustrating the photomask inspection method according to the first embodiment, where
Figure 4B:
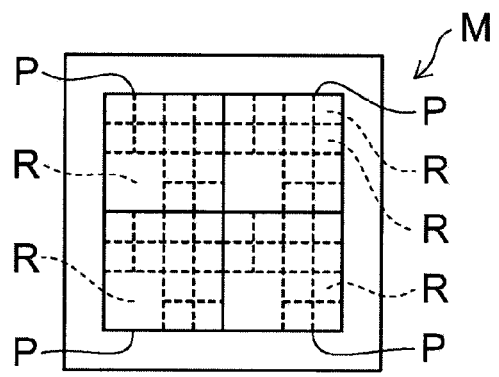
Figure 4C:
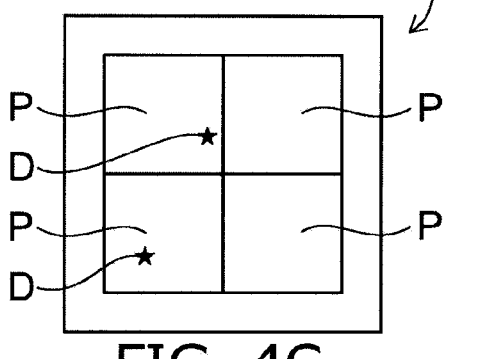

In the photomask F illustrated in FIG. 4A, it is assumed that four of the same pattern P are arranged in two rows by two columns. As illustrated in FIG. 4B, the disposition of a plurality of unit regions R of the photomask F is written to a redundancy map M stored in the redundancy map storage unit 26. The disposition of the unit regions R is the same for each pattern P. As illustrated in FIGS. 4A and 4B, no defect is detected prior to the inspection of the first photomask.

First, the light source 12 is turned on. Light radiated by the light source 12 is concentrated by the condensing lens 13 into a limited region on the XY stage 14, passes through aperture portions of the photomask F held by the XY stage 14, diverges, is concentrated once again by the objective lens 15, and is incident on the image sensor 16. Thereby, the image sensor 16 detects the light transmitted by a portion of the photomask F. The pattern image of the photomask F is enlarged, for example, several hundred times and optically formed on the image sensor 16 by the optical system including the condensing lens 13, the objective lens 15, and the like.

At this time, only a portion of the photomask F can be disposed in the optical path; the light reception surface area of the image sensor 16 is small; and light transmitted by only one portion of the photomask F can be received at a time. However, the stage control circuit 17 can drive the XY stage 14 to move the photomask F in an X direction and a Y direction and scan the entire photomask F based on a command of the CPU 22.

The sensor circuit 18 sequentially receives signals output by the image sensor 16. The sensor circuit 18 creates an analog optical image for the entire photomask F. The size of each pixel of the optical image may be, for example, a square having sides of 100 nanometers each. The sensor circuit 18 outputs the optical image to the A/D conversion circuit 19. The A/D conversion circuit 19 converts the analog optical image to a digital optical image (sensor image) and outputs the result to the defect determination circuit 30.

On the other hand, the CPU 22 reads the design data of the photomask F from the design data storage unit 25 and outputs the design data to the pattern transformation circuit 27. The pattern transformation circuit 27 transforms the design data into multi-level data having about the same number of gradations as the resolution of the image sensor 16 for each pixel of about the same size as the resolution of the image sensor 16 and outputs the result to the reference image creation circuit 28. The reference image creation circuit 28 performs filter processing and the like on the transformed data and creates a reference image. The pixel size of the reference image is the same as the pixel size of the sensor image, and is, for example, a square having sides of 100 nanometers each. The reference image is an image that approximates an optical image obtained in the case where an image of a virtual photomask having no defects and represented by the design data stored in the design data storage unit 25 is captured by the image sensor 16. The reference image creation circuit 28 outputs the reference image to the defect determination circuit 30.

Then, the defect determination circuit 30 creates a difference image from the optical image (the sensor image) received from the A/D conversion circuit 19 and the reference image received from the reference image creation circuit 28 and determines the existence/absence of defects in the photomask F based on the difference image.

Then, as illustrated in step S5 of FIG. 3, the defect determination circuit 30 determines whether or not the detected defects include a redundancy defect. The operator also may perform this determination. In such a case, the defect determination circuit 30 outputs the sensor image and the difference image, the operator performs the determination based on the sensor image and the difference image, and the operator inputs the determination result into the defect determination circuit 30. Alternatively, the defect determination circuit 30 may perform a first determination, and the operator may perform a final determination. In such a case, the defect determination circuit 30 outputs the sensor image and the difference image with the result of the first determination, and the operator performs the final determination referring to this information and modifies the first determination result if necessary. As a result, the flow proceeds to step S7 in the case where no redundancy defects exist. On the other hand, the flow proceeds to step S6 in the case where the detected defects include a redundancy defect.

Figure 4D:
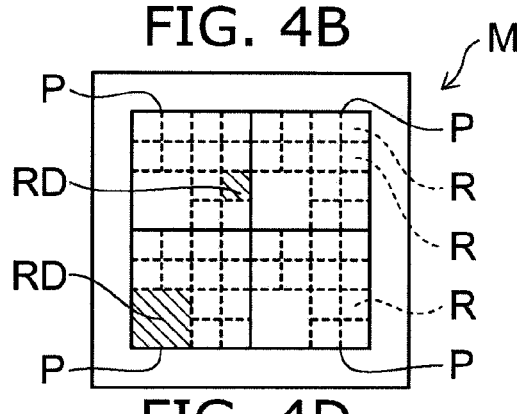

In step S6, the defect determination circuit 30 acquires the coordinates of the redundancy defect and writes the coordinates to the redundancy map storage unit 26. Thereby, the CPU 22 renews the redundancy map M. For example, in the case of the coordinates of redundancy defects D illustrated in FIG. 4C, the unit regions R including the coordinates of the redundancy defects D are identified as "redundancy-relevant regions RD" in the redundancy map M as illustrated in FIG. 4D. Then, the flow proceeds to step S7, and information regarding the defects is output. These defects may include defects other than redundancy defects. Thereby, the inspection of the first photomask ends.

Then, the second photomask of the mask set is inspected.

Here, the second photomask is fixed to the XY stage 14, after which the flow proceeds from step S1 to step S2 of FIG. 3. The CPU 22 reads the redundancy map M of another photomask inspected previously, that is, the first photomask already inspected, from the redundancy map storage unit 26 and stores the redundancy map M in the RAM 24. As illustrated in FIG. 4D, the redundancy-relevant regions RD corresponding to the redundancy defects D detected in the first photomask are written to the redundancy map M.

Figure 4E:
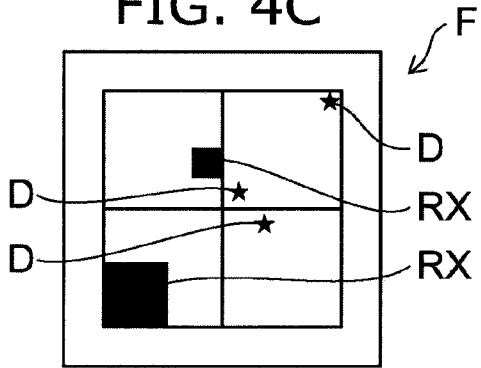

Then, as illustrated in FIG. 4E and step S3 of FIG. 3, the CPU 22 specifies the redundancy-relevant regions RD written to the redundancy map M as non-inspection regions RX.

Continuing as illustrated in step S4, an inspection is executed for the second photomask. At this time, the inspection is not performed for the regions specified as the non-inspection regions RX in step S3, that is, the regions identified as the redundancy-relevant regions RD in the inspection of the first photomask. Specifically, the CPU 22 sends a command to the stage control circuit 17, and the non-inspection regions RX are not scanned.

Figure 4F:
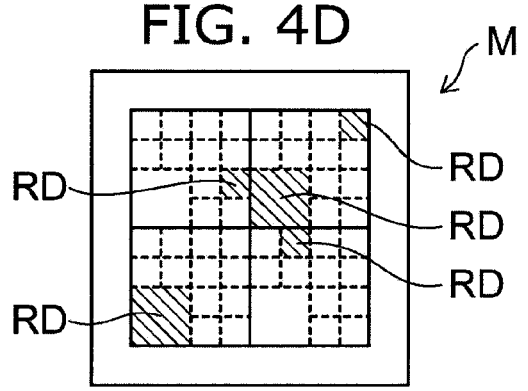

Then, as illustrated in step S5, it is determined whether or not the detected defects include a redundancy defect. The flow proceeds to step S6 in the case where a redundancy defect exists, and the redundancy map is renewed. For example, in the case of the coordinates of the redundancy defects D illustrated in FIG. 4E, the redundancy map M is renewed as illustrated in FIG. 4F. The flow then proceeds to step S7, the inspection result is output, and the inspection of the second photomask ends.

Figure 4G:
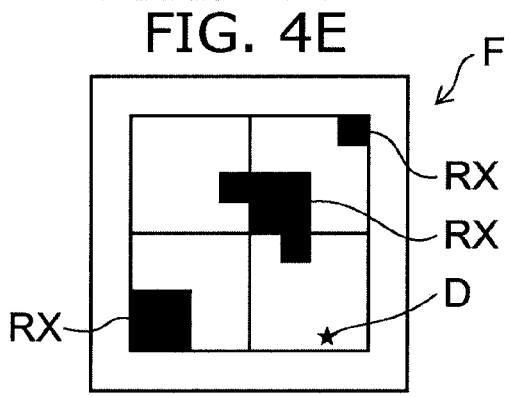
Figure 4H:
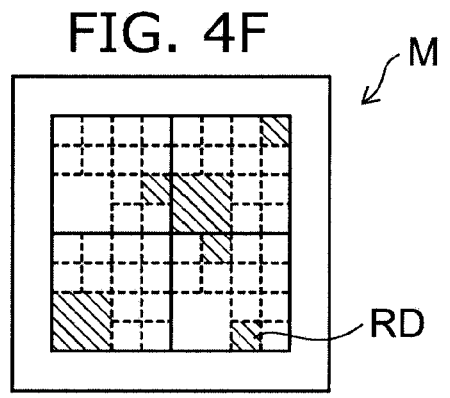

Steps similar to those for the second photomask are executed also during the inspection of a third photomask. At this time, as illustrated in FIG. 4G, the redundancy-relevant regions RD identified in the inspection of the second photomask are specified as non-inspection regions RX, and an inspection is not performed for the regions specified as the non-inspection regions RX in the inspections of the first and second photomasks. Then, as illustrated in FIG. 4H, the redundancy map M is renewed to reflect a newly detected redundancy defect D.

The method for inspecting fourth and subsequent photomasks is similar to the method for inspecting the second and third photomasks. That is, during the inspection of the photomask F, the redundancy-relevant regions RD including the coordinates of the redundancy defects D detected in another photomask inspected previously are specified as the non-inspection regions RX and the inspection is not performed for the non-inspection regions RX. Then, the photomask F is inspected; defects are detected; it is determined whether or not the detected defects include a redundancy defect D, that is, a defect positioned in a unit region R replaceable with another unit region R to remedy the photomask; and the redundancy map M is renewed in the case where a redundancy defect D exists. Thus, the inspection of the plurality of photomasks of the mask set ends.

Effects of this embodiment will now be described.

Multiple exposure layers are necessary in processes that manufacture semiconductor devices by processing a semiconductor wafer. The number of photomasks necessary is at least the number of layers. Recently, leading-edge fine patterning technology is being used including double exposure, double patterning, and the like. In such a case, two photomasks are necessary for one layer. Thus, there is a tendency in recent years for the number of photomasks necessary to manufacture a semiconductor device to increase more and more.

On the other hand, as described in the Background Art, applications of redundancy technology for photomasks have advanced in recent years. Specifically, although an unrestorable defect of the photomask is transferred to the semiconductor device and becomes a defect of the semiconductor device, the unit region of the semiconductor device in which the defect is positioned is not used and is replaced with another unit region free of defects.

In such a case, the unit region of one photomask of the semiconductor device for which the defect is transferred is not used regardless of the existence or absence of defects in regions of other photomasks (redundancy-relevant regions) corresponding to the unit region. Therefore, the existence or absence of defects in the redundancy-relevant region of other photomasks does not affect the number of usable unit regions in the completed semiconductor device. In other words, in the case where a defect exists in one unit region of one photomask, defects in other photomasks in regions (redundancy-relevant regions) corresponding to the unit region all lie above the one unit region when the layers are stacked and therefore do not affect the number of usable unit regions of the completed semiconductor device.

Therefore, defects in common unit regions of a plurality of photomasks may be considered to be substantially one defect from the aspect of effects on the completed semiconductor device. Accordingly, counting each of these defects undesirably results in a number of defects greater than the substantial number of defects, and such results do not match actual results. Therefore, photomasks that would be remediable by redundancy technology are determined to be defective and are unfortunately destroyed. Thereby, the photomask yield declines, and manufacturing costs increase.

Therefore, in this embodiment, an inspection is not performed for unit regions of the second and subsequent photomasks of the mask set in the case where the unit region (the redundancy-relevant region) includes coordinates of a redundancy defect detected in another photomask inspected previously. Therefore, defects occurring in common unit regions are not counted multiple times. Thus, in this embodiment, the substantial number of defects when the layers are stacked can be accurately evaluated by considering the positional relationship of the defects among a plurality of photomasks. As a result, the photomask yield can be improved, and manufacturing costs can be reduced.

Further, as described above, in the case where a defect exists in one unit region of one photomask, the existence or absence of defects in regions (redundancy-relevant regions) in other photomasks corresponding to this region do not affect the number of usable unit regions in the completed semiconductor device. Accordingly, there may be little significance in performing an inspection of this region for the other photomasks.

Therefore, in this embodiment, redundancy-relevant regions in the second and subsequent photomasks are not inspected. Thereby, inspections are omitted for regions where little advantage is gained by inspecting, and the inspection time can be reduced. By not inspecting the redundancy-relevant regions, the defects occurring in these regions are not restored, and the time and cost of restoring is unnecessary. As a result, the throughput of the photomask inspection improves.

A second embodiment of the present invention will now be described.

The objects to be inspected in this embodiment are a plurality of photomasks used to manufacture the same semiconductor device similar to those of the first embodiment described above and are photomasks to which redundancy technology is applied.

Although the configuration of the pattern inspection apparatus according to this embodiment is similar to the configuration of the pattern inspection apparatus according to the first embodiment described above (referring to FIG. 1 and FIG. 2), a portion of the contents of the program stored in the ROM 23 is different. Specifically, the program of this embodiment causes the CPU 22 to set the redundancy-relevant regions RD to be defect non-output regions RY instead of the non-inspection regions RX. Otherwise, the configuration of the pattern inspection apparatus according to this embodiment is similar to that of the first embodiment described above.

Operations of the pattern inspection apparatus according to this embodiment having the configuration described above, that is, the photomask inspection method according to this embodiment, will now be described.

Figure 5:
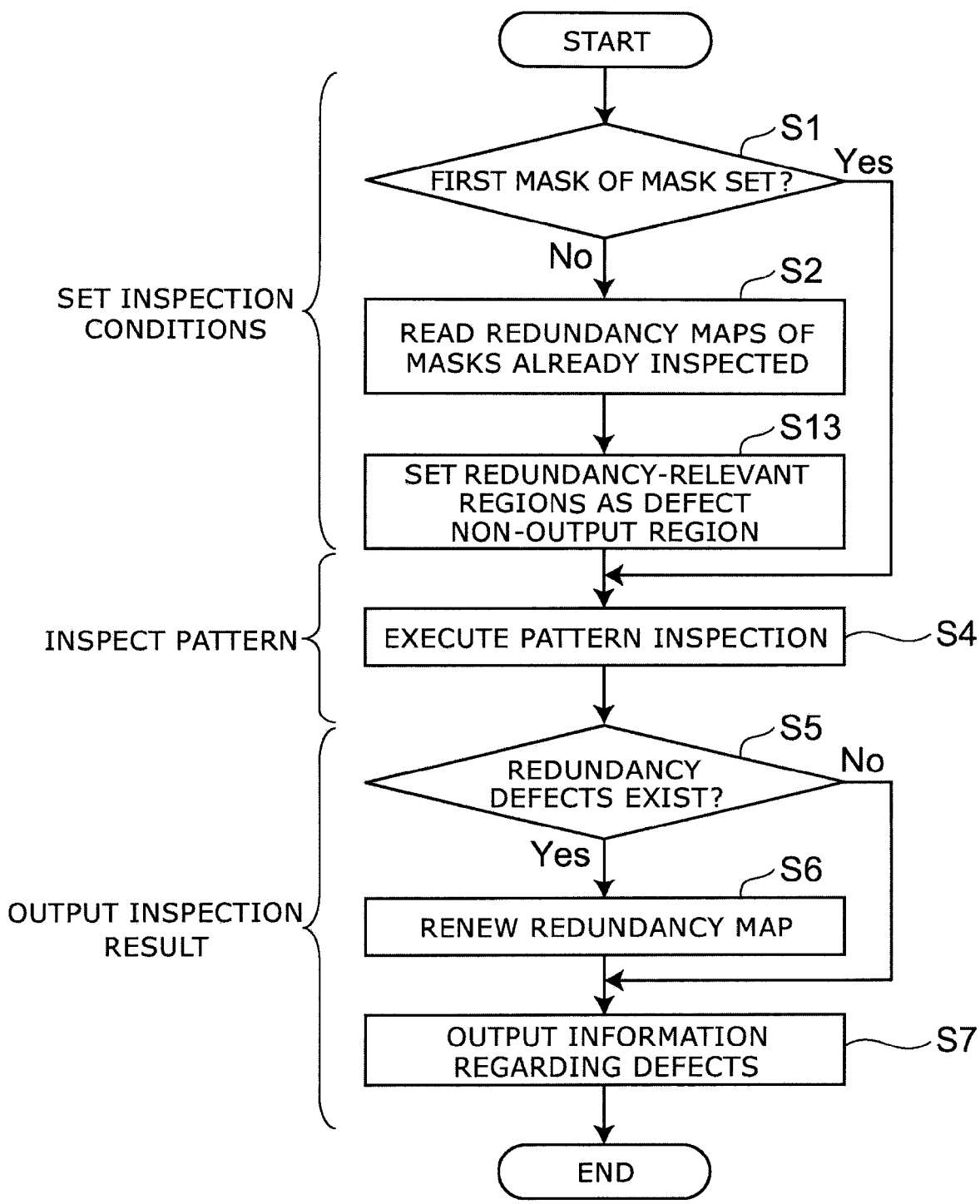
FIG. 5 is a flowchart illustrating a photomask inspection method according to a second embodiment.
Figure 6A:
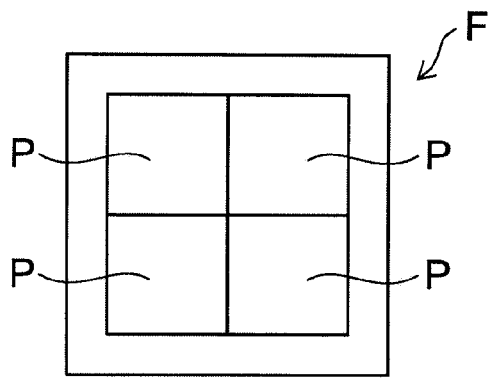
FIGS. 6A to 6H are views illustrating the photomask inspection method according to the second embodiment, where
Figure 6B:
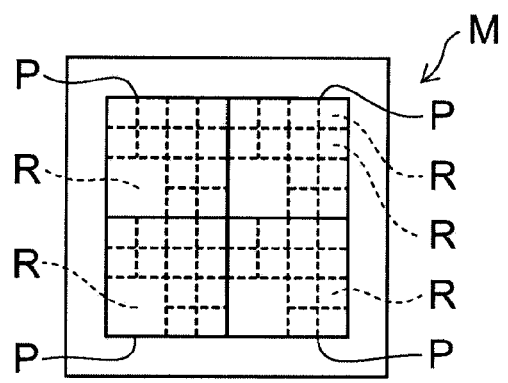
Figure 6C:
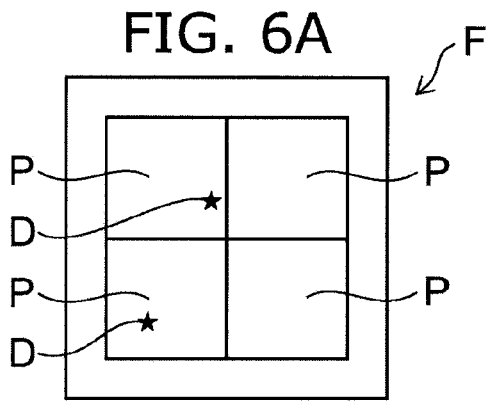
Figure 6D:
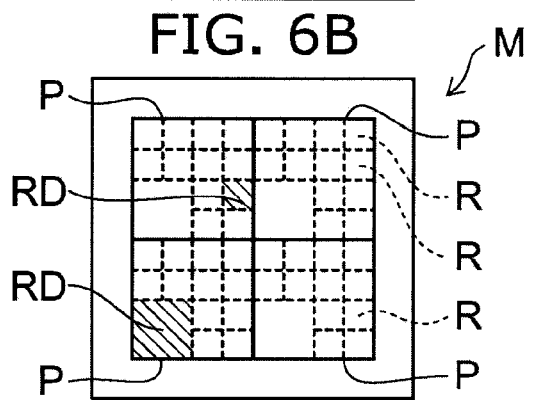
Figure 6E:
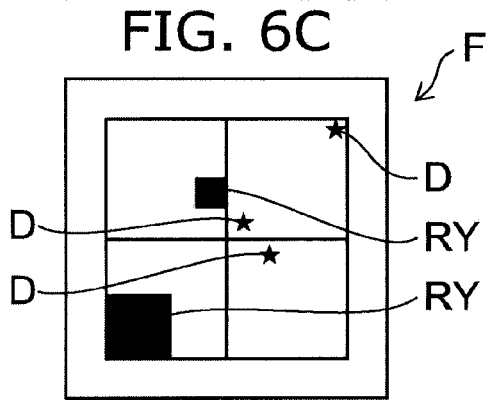
Figure 6F:
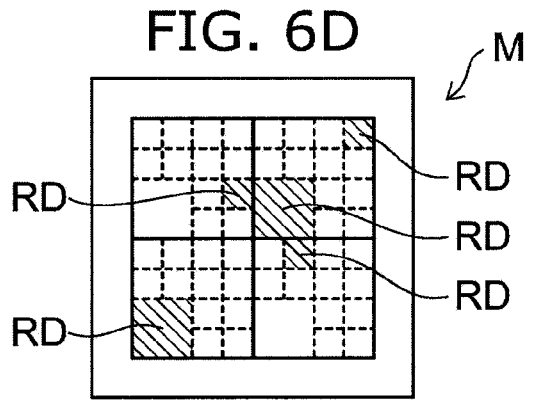
Figure 6G:
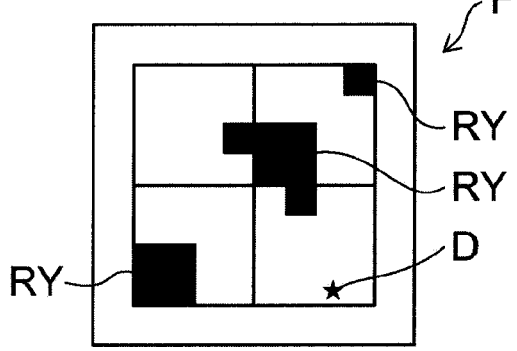
Figure 6H:
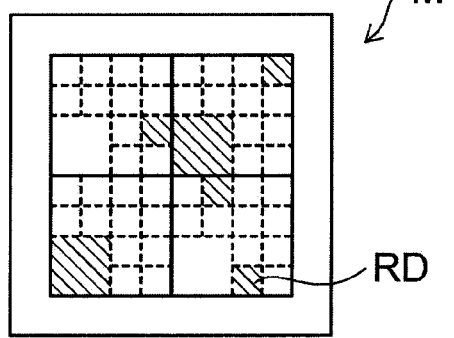

FIG. 5 is a flowchart illustrating the photomask inspection method according to this embodiment.

FIGS. 6A to 6H illustrate the photomask inspection method according to this embodiment. FIGS. 6A, 6C, 6E, and 6G illustrate inspection results. FIGS. 6B, 6D, 6F, and 6H illustrate redundancy maps.

Comparing the photomask inspection method according to this embodiment to the first embodiment described above, step S3 (referring to FIG. 3) is replaced with step S13 as illustrated in FIG. 5 and FIGS. 6A to 6H. In step S13, the CPU 22 sets the redundancy-relevant regions RD to be the defect non-output regions RY.

The defect non-output regions RY also are inspected when executing the inspection of the photomask in step S4. However, when the defect determination circuit 30 outputs information regarding the defects in step S7, the CPU 22 sends a command to the defect determination circuit 30 not to output information of the defects detected in the defect non-output regions RY. Thereby, the defects detected in the defect non-output regions RY are not output.

Thus, in this embodiment, information is not output for defects detected in the second and subsequent photomasks in the case where the coordinates of the defects are included in the unit regions (the redundancy-relevant regions) including the coordinates of the redundancy defects detected in another photomask inspected previously. Otherwise, the configuration of the photomask inspection method according to this embodiment is similar to that of the first embodiment described above.

Effects of this embodiment will now be described.

As described above, during the output of the inspection results of the second and subsequent photomasks in this embodiment, inspections are performed but information of the detected defects are not output for regions identified as redundancy-relevant regions in previous inspections. Thus, similarly to the first embodiment described above, defects occurring in common unit regions are not counted multiple times. As a result, the substantial number of defects when the layers are stacked can be accurately evaluated, the photomask yield can be improved, and manufacturing costs can be reduced.

Further, according to this embodiment, information of defects in the redundancy-relevant regions is not output. Thereby, these defects are not restored, and the time and cost of restoring is unnecessary. As a result, the throughput of the photomask inspection improves.

This embodiment is different from the first embodiment described above in that the redundancy-relevant regions also are inspected. Thereby, information of the defects in the redundancy-relevant regions also can be acquired. As a result, in the case where one or more of the photomasks of the mask set is replaced, it is possible to determine whether or not the newly combined mask set is usable as an entirety.

This effect will now be described specifically. In the case where the number of usable unit regions for the mask set as an entirety does not satisfy a specified number and the mask set is determined to be defective, the photomask from the a plurality of photomasks of the mask set having a particularly large number of redundancy defects is replaced with a good photomask having fewer defects. In such a case, some unit regions that had been identified as redundancy-relevant regions are no longer redundancy-relevant regions. If the defect information of these unit regions for the other photomasks is available and it can be determined that no unrestorable defects exist in these unit regions, it can be determined that these unit regions are usable for the mask set as an entirety. If the number of usable unit regions of the mask set as an entirety satisfy the specified number, it can be determined that the mask set is good as an entirety. Thereby, a mask set determined to be defective may be remedied by merely replacing one or more of the photomasks without destroying the entirety. As a result, the photomask yield improves, and manufacturing costs are reduced.

A third embodiment of the present invention will now be described.

The pattern inspection apparatus according to this embodiment is an apparatus for inspecting a semiconductor device. In other words, in this embodiment, the inspection object is the semiconductor device and not the photomask. Redundancy technology is applied to the semiconductor device. That is, a plurality of mutually replaceable unit regions are set in the semiconductor device. The configuration of the inspection apparatus is similar to the configuration of the pattern inspection apparatus according to the first embodiment described above (referring to FIG. 1 and FIG. 2).

A semiconductor device inspection method according to this embodiment will now be described.

The semiconductor device, i.e., the inspection object in this embodiment, is manufactured by performing fashioning of the semiconductor wafer in a plurality of stages. In this embodiment, the existence/absence of defects is evaluated for an intermediate structural body constructed at each of the plurality of manufacturing stages. In other words, while a plurality of photomasks used to manufacture the same semiconductor device are sequentially inspected in the first embodiment described above, intermediate structural bodies of a plurality of stages of steps to manufacture the same semiconductor device are sequentially inspected in this embodiment.

In this embodiment, similarly to the first embodiment described above, defects of the intermediate structural body, i.e., the inspection object, are detected, and it is determined whether or not the detected defects are redundancy defects. The unit regions in which redundancy defects are detected are identified as redundancy-relevant regions; the redundancy-relevant regions are set to be non-inspection regions for inspections of the intermediate structural bodies of subsequent manufacturing stages; and the inspection is not performed for the non-inspection regions. In other words, during the inspections of the intermediate structural bodies of the second and subsequent manufacturing stages, the unit regions (the redundancy-relevant regions) including the coordinates of the redundancy defects detected in the intermediate structural body of a previous manufacturing stage are not inspected. Otherwise, the inspection method of this embodiment is similar to that of the first embodiment described above.

Effects of this embodiment will now be described.

Generally, a semiconductor wafer goes through several hundred to several thousand manufacturing stages to manufacture a semiconductor device. It is exceedingly difficult to manufacture without one defect in all of the manufacturing stages. Therefore, redundancy technology is applied to many semiconductor devices. That is, a plurality of mutually replaceable unit regions are provided on the semiconductor device; and in the case where an unrestorable defect occurs in a unit region, the semiconductor device is remedied by replacing the unit region with another unit region.

In such a case, if a redundancy defect occurs in a unit region in a manufacturing stage, the unit region is not used even in the case where no defects occur in subsequent manufacturing stages. Therefore, for this unit region, the existence or absence of defects occurring in subsequent manufacturing stages does not affect the number of usable unit regions in the completed semiconductor device. Accordingly, defects in common unit regions of a plurality of intermediate structural bodies of different manufacturing stages may be considered to be substantially one defect from the aspect of effects on the completed semiconductor device.

Therefore, in this embodiment, the unit regions (the redundancy-relevant regions) including the coordinates of the redundancy defects detected in an intermediate structural body of a previous stage are not inspected when inspecting the intermediate structural bodies of the second and subsequent stages. Thereby, defects occurring in common unit regions are not counted multiple times, and the substantial number of defects affecting the completed semiconductor device can be accurately evaluated. As a result, the semiconductor device yield can be improved, and manufacturing costs can be reduced.

In this embodiment, redundancy-relevant regions of intermediate structural bodies of the second and subsequent stages are not inspected. Thereby, inspections are omitted for regions where little advantage is gained by inspecting, and the inspection time can be reduced. Further, defects occurring in the redundancy-relevant regions are not restored, and therefore the time and cost necessary for restoring can be omitted. As a result, the throughput of the semiconductor device inspections improves.

A fourth embodiment of the present invention will now be described.

This embodiment is a combination of the second embodiment and the third embodiment described above. In other words, the intermediate structural bodies of the semiconductor device for which redundancy technology is applied are inspected by a method similar to that of the second embodiment using an inspection apparatus similar to the pattern inspection apparatus according to the second embodiment described above.

In other words, the intermediate structural bodies of the semiconductor device, i.e., the inspection object, are inspected; defects are detected; it is determined whether or not the detected defects are redundancy defects; and information regarding the defects is output. At this time, the unit regions in which the redundancy defects are detected are identified as redundancy-relevant regions; the redundancy-relevant regions are set to be defect non-output regions for the inspections of the intermediate structural bodies of subsequent manufacturing stages; and although the inspections are performed, the defect information is not output. That is, information is not output for defects detected in the intermediate structural bodies of the second and subsequent manufacturing stages in the case where the coordinates of the defects are included in the unit region (the redundancy-relevant region) including the coordinates of the redundancy defect detected in the intermediate structural body of a previous manufacturing stage. Otherwise, the inspection method of this embodiment is similar to that of the second embodiment described above.

The effects of this embodiment are similar to those of the second embodiment described above. Namely, in the case where defects occur in common unit regions for the intermediate structural bodies of a plurality of manufacturing stages, the defects are prevented from being undesirably counted multiple times, and the substantial number of defects affecting the completed semiconductor device can be accurately evaluated. As a result, the semiconductor device yield can be improved, and manufacturing costs can be reduced. Further, defects of unused unit regions are not restored, and the productivity of the semiconductor device can be improved.

Hereinabove, the present invention is described with reference to exemplary embodiments. However, the present invention is not limited to these embodiments. Additions, deletions, or design modifications of components or additions, omissions, or condition modifications of steps appropriately made by one skilled in the art in regard to the embodiments described above are within the scope of the present invention to the extent that the purport of the present invention is included.

For example, in the embodiments described above, an example is illustrated in which light transmitted by an inspection object optically forms an image on an image sensor. However, the present invention is not limited thereto. Light reflected by the inspection object may optically form an image on the image sensor, or both transmitted light and reflected light may optically form an image on the image sensor in a mixed state. Although the reference image is created based on design data in the embodiments described above, the present invention is not limited thereto. The reference image may be stored beforehand in a storage unit and read from the storage unit during the inspection, or may be input from the exterior of the pattern inspection apparatus for each inspection. Further, although examples are illustrated in the embodiments described above in which the redundancy map indicates positions and numbers of unit regions ascertained from information regarding the unit regions added to the design data for redundancy and coordinates of the redundancy defects written thereto, the present invention is not limited thereto. The items of information written to the redundancy map may be increased as necessary.

The invention claimed is:

1. A pattern inspection apparatus for inspecting a plurality of photomasks each used to manufacture a same semiconductor device, the photomasks each including a plurality of mutually replaceable unit regions set therein, the apparatus comprising:
 a redundancy map storage unit storing a redundancy map indicating a disposition of the unit regions;
 an image capture unit for acquiring optical images of the photomasks;
 a defect determination unit which:
  compares an acquired optical image of a first one of the photomasks to a reference image associated with the first one of the photomasks to detect a defect,
  determines whether a detected defect is a redundancy defect positioned in a first one of the unit regions replaceable with a second one of the unit regions to render usable the first one of the photomasks,
  updates the redundancy map to record a coordinate of the redundancy defect, and
  outputs information regarding the detected defect; and
 a control unit which:
  identifies, for a second one of the photomasks, one of the unit regions on the second one of the photomasks that includes the coordinate of the detected redundancy defect as a redundancy-relevant region on the second one of the photomasks, and
  instructs the image capture unit not to inspect the redundancy-relevant region.

2. A pattern inspection apparatus for inspecting an intermediate structural body at each stage of a plurality of manufacturing stages of a semiconductor device, the intermediate structural body at each stage including a plurality of mutually replaceable unit regions set therein, the apparatus comprising:
 a redundancy map storage unit storing a redundancy map indicating a disposition of the unit regions;
 an image capture unit for acquiring optical images of the intermediate structural body at the plurality of manufacturing stages;
 a defect determination unit which:
  compares an acquired optical image of the intermediate structural body at a first stage to a reference image associated with the intermediate structural body at the first stage to detect a defect,
  determines whether a detected defect is a redundancy defect positioned in a first one of the unit regions replaceable with a second one of the unit regions to remedy the intermediate structural body,
  updates the redundancy map to record a coordinate of the redundancy defect, and
  outputs information regarding the detected defect; and
 a control unit which:
  identifies, for the intermediate structural body at a second stage, one of the unit regions on the intermediate structural body at the second stage that includes the coordinate of the detected redundancy defect as a redundancy-relevant region, and
  instructs the image capture unit not to inspect the redundancy-relevant region.

3. The apparatus according to claim 1, further comprising a reference image creation unit creating the reference image based on design data of the first one of the photomasks.

4. The apparatus according to claim 2, further comprising a reference image creation unit creating the reference image based on design data of the intermediate structural body at the first stage.

5. The apparatus according to claim 1, wherein the control unit further instructs the defect determination unit not to output information of a defect detected in the redundancy-relevant region.

6. The apparatus according to claim 2, wherein the control unit further instructs the defect determination unit not to output information of a defect detected in the redundancy-relevant region.

* * * * *